United States Patent [19]

Lade et al.

[11] Patent Number: 4,675,980
[45] Date of Patent: Jun. 30, 1987

[54] METHOD FOR MAKING VERTICALLY LAYERED MOMOM TUNNEL DEVICE

[75] Inventors: Robert W. Lade, Milwaukee; James A. Benjamin, Waukesha; Herman P. Schutten, Milwaukee, all of Wis.

[73] Assignee: Eaton Corporation, Cleveland, Ohio

[21] Appl. No.: 863,312

[22] Filed: May 15, 1986

Related U.S. Application Data

[62] Division of Ser. No. 683,729, Dec. 19, 1984, Pat. No. 4,642,665.

[51] Int. Cl.⁴ ................. H01L 21/467; H01L 21/475; H01L 27/14; H01L 49/02
[52] U.S. Cl. ........................................ 29/571; 29/579; 29/590
[58] Field of Search ................. 29/579, 590, 591, 571; 156/662, 664, 667; 427/27, 61, 69, 89, 90, 91, 124, 125

[56] References Cited

U.S. PATENT DOCUMENTS 3,500,142 3/1970 Kahng ................................ 357/6 X
4,543,320 9/1985 Vijan ................................ 430/314
4,549,194 10/1985 Calviello ................................ 357/30

FOREIGN PATENT DOCUMENTS 0186346 7/1986 European Pat. Off. ................. 357/4

OTHER PUBLICATIONS

Farber et al., IBM Tech. Disc. Bull., V. 9, No. 11, (Apr. 1967), pp. 1669–1671.

*Primary Examiner*—Olik Chaudhuri
*Attorney, Agent, or Firm*—Andrus, Sceales, Starke & Sawall

[57] ABSTRACT

MOMOM structural geometry and fabrication techniques are is disclosed. First and second metal layer strips (6 and 10) are supported on an insulating substrate (4) and have vertically overlapped portions sandwiched between insulating layers (8, 12). A generally vertical side (18) is defined through the layers to the substrate to expose vertical edges (20, 24) of the metal layers which are oxidized (32, 34) and covered by a third metal layer (44) extending therebetween. In the preferred embodiment, the middle insulating layer (8) is undercut (28), oxidized (36, 40), and filled with metallization (50), to provide a vertical rectilinear conduction path.

7 Claims, 8 Drawing Figures

METHOD FOR MAKING VERTICALLY LAYERED MOMOM TUNNEL DEVICE

This is a divisional of application Ser. No. 683,729 filed Dec. 19, 1984, now U.S. Pat. No. 4,642,665.

BACKGROUND AND SUMMARY

The invention relates to metal-oxide-metal-oxide-metal, MOMOM, devices and fabrication methods.

In an MOMOM device, current is conducted by the tunneling of carriers such as electrons through the oxide barriers between the metal layers. Tunneling probability is determined by various factors, including the excitation level of the carriers, the work function and the height of the barrier between the metal and the oxide, the thickness of the oxide, etc. The MOMOM structure is analogous to a bipolar transistor, and it is desirable to have a very thin middle metal base region so that carriers surmounting the first oxide barrier from the end emitter metal will coast through the base metal layer and be collected in the end collector metal layer. It is also desirable to provide independently variable work function barrier heights and oxide thicknesses for the emitter-base junction and the base-collector junction. This enables differing input and output impedance values.

The present invention provides structural geometry and simplified efficient processing fabrication of a vertically layered MOMOM device satisfying the above desirable characteristics and capable of operation in the visible region. Extremely small junction areas are provided, for example $10^{-10}$ cm$^2$, capable of detecting signals in the visible wavelength region, i.e., optical frequencies can excite the carriers to cross the junction barriers.

DETAILED DESCRIPTION

Figure 1:
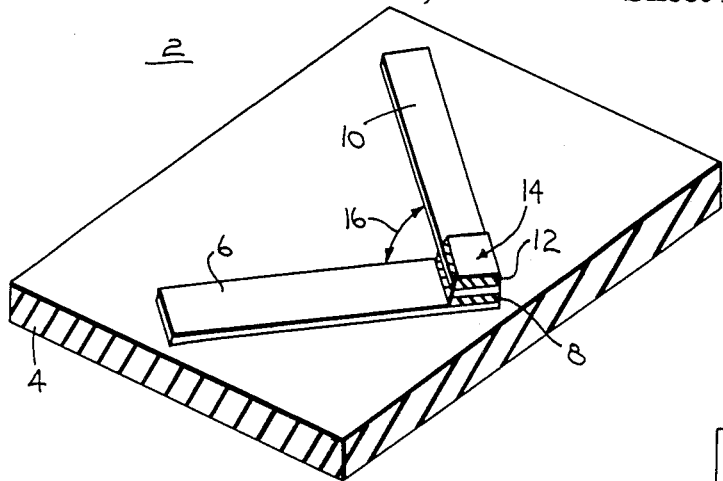
FIG. 1 shows a perspective view showing initial processing steps for MOMOM tunnel device structure in accordance with the invention, with portions of the insulating layers 8 and 12 cut away for clarity.
Figure 2:
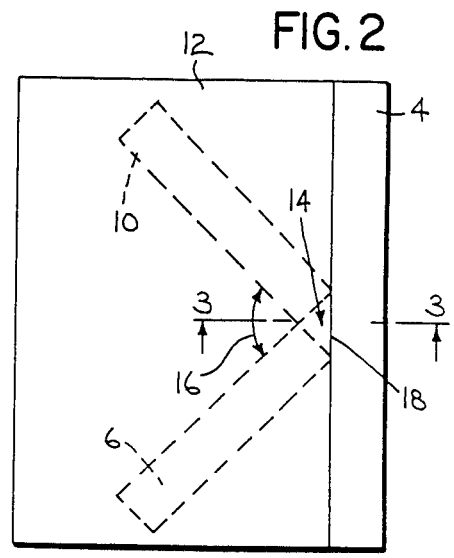
FIG. 2 is a top plan view of the structure of FIG. 1 after a further processing step.

FIG. 1 shows a partially formed MOMOM tunnel device 2 in accordance with the invention. On insulating substrate 4 there is deposited a first metal layer or strip 6, followed by formation of a first insulating layer 8, followed by deposition of a second metal layer or strip 10, followed by formation of a second insulating layer 12. The insulating layers may be formed in a variety of manners, as by deposition, or oxidation of the underlying metal layer, or the like. The layers have vertically overlapped portions at 14. Insulating layers 8 and 12 have been cutaway to show only the overlapped portions at 14. The remainder of insulating layers 8 and 12 cover the entire lateral horizontal area of substrate 4. The vertical stack at 14 is formed by metal layer 6 on substrate 4, insulating layer 8 on metal layer 6, metal layer 10 on insulating layer 8, and insulating layer 12 on metal layer 10. FIG. 2 shows a top plan view of the structure of FIG. 1 without the insulation layers cutaway, and hence metal layer strips 6 and 10 are shown in dashed line. Metal layer strips 6 and 10 form a V-shape at a substantially 90° angle 16 to each other, to minimize electromagnetic coupling. The area of overlap 14 is at the conjoint of the legs of the V.

Figure 3:
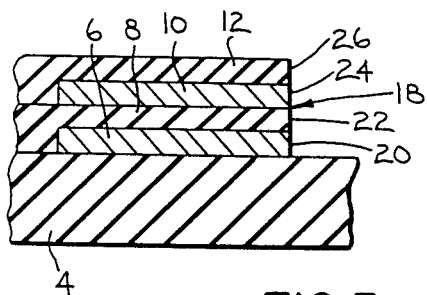
FIG. 3 is a sectional view taken along line 3—3 of FIG. 2.

After the noted layering, a generally vertical side 18 is formed through the layers to substrate 4 by anisotropic etching along a mask line extending diagonally across overlap area 14. This etched generally vertical side 18 is shown in FIGS. 2 and 3, and exposes the vertical edges 20, 22, 24 and 26 of horizontal layers 6, 8, 10 and 12, respectively.

Figure 6:
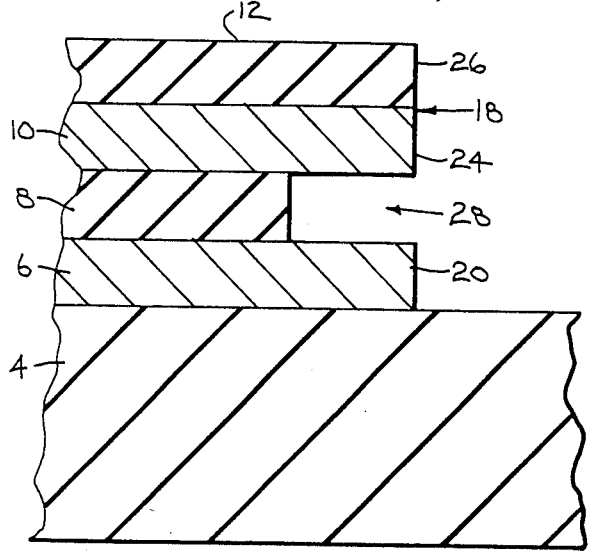
FIG. 6 is a view like FIG. 3 and showing an additional preferred processing step.

In the preferred embodiment, insulating layer 8 is formed of a material, for example heavily phosphorous doped silicon oxide, which has a much faster etch rate than insulating substrate 4 and insulating layer 12. An anisotropic etch is performed on the structure of FIG. 3 to undercut layer 8 as shown at 28 in FIG. 6. Undercut 28 extends horizontally inwardly from vertical edge 18. Depending on the differential etching rate, top insulation layer 12 may also etch slightly inwardly from vertical edge 18. The structure of FIG. 6 is then oxidized in a plasma directed field, with the field being directed generally vertically as shown at 30 in FIG. 7. This causes formation of first and second oxide layers 32 and 34 on the exposed vertical edges 20 and 24 of metal layers 6 and 10. Oxidation layer 32 also extends horizontally at 36 along the top surface 38 of metal layer 6 along undercut 28. Oxidation layer 34 also extends horizontally at 40 along the bottom underside surface 42 of metal layer 10 along undercut 28 and spaced above horizontal first oxidation layer extension 36. Because of the field directed plasma oxidation, vertical oxidation layer portions 32 and 34 are much thicker than horizontal oxidation layer portions 36 and 40. Metal layers 6 and 10 may be of different material, thus also affording a differential oxidation growth rate between the first and second metal layers.

Figure 4:
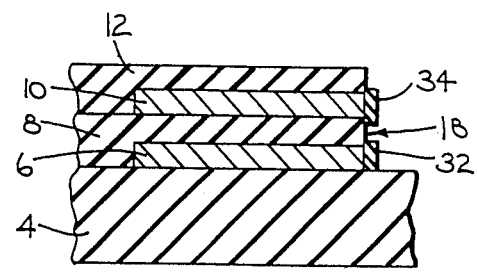
FIG. 4 is a view like FIG. 3 showing a further processing step.
Figure 7:
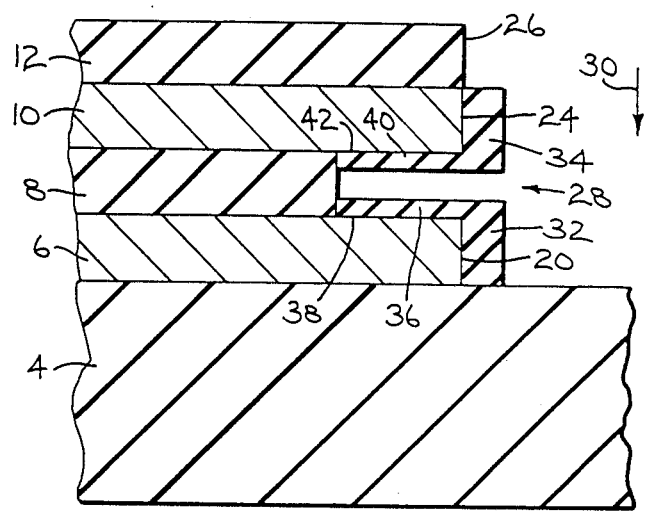
FIG. 7 is a view like FIG. 6 showing a further processing step.

The undercut step of FIG. 6 may be skipped, resulting in the structure of FIG. 4 after oxidation. The structure of FIG. 7 is preferred because of the vertical rectilinear current flow path afforded thereby from metal layer 6 to metal layer 10 in the finished structure.

Figure 5:
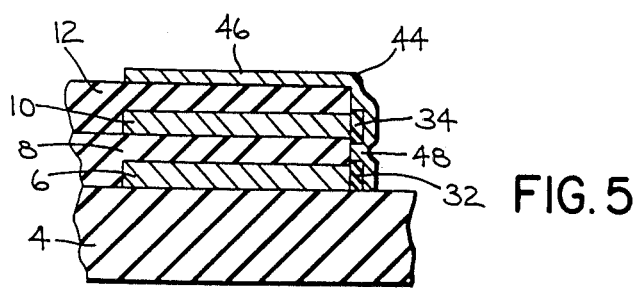
FIG. 5 is a view like FIG. 4 showing a further processing step.
Figure 8:
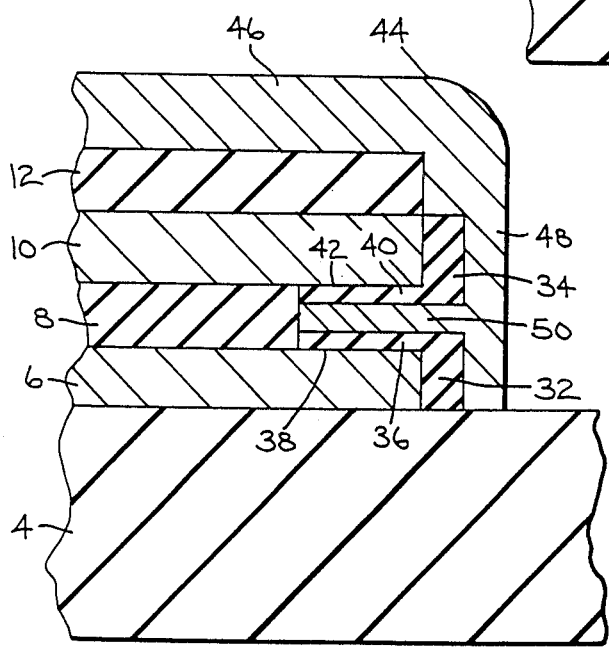
FIG. 8 is a view like FIG. 7 showing a further processing step.

A third metal layer 44, FIGS. 5 and 8, is then deposited and extends horizontally at 46 along the top of insulating layer 12 and vertically at 48 along the vertical side 18 of the layers over and between the first and second oxidation layers 32 and 34. In FIG. 8, the third metal layer has a portion 50 extending horizontally inwardly into undercut 28 between horizontal first and second oxidation layer extensions 36 and 40. In FIG. 8, the MOMOM current flow path is vertically rectilinear through metal layer 6, oxidation layer extension 36, metallization extension 50, oxidation layer extension 40, and metal layer 10. In FIG. 5, the path is through metal layer 6, oxidation layer 32, metallization portion 48, oxidation layer 34, and metal layer 10. It is thus seen that the M-O-M-O-M current flow path is through: metal layer 6 - oxidation layer 32 - metallization 44 - oxidation layer 34 - metal layer 10.

The structural geometry and processing steps of the invention enable different material and thicknesses to be used for metal layers 6 and 10, which in turn can selectively provide differing work functions for barrier heights, different oxidation growth rates, and differing junction areas if desired. In a desirable aspect of the preferred embodiment in FIG. 8, differing materials and thicknesses may be used for metal layers 6 and 10 to afford differing work function barrier heights and oxidation rates for differing barrier heights across horizontal oxide layer extensions 36 and 40 and differing vertical thicknesses of oxide layer extensions 36 and 40, yet afford junctions at 38 and 42 which have substantially the same area. In some implementations, it may be desirable to have the same input and output junction area in order to eliminate such parameter in varying input and output impedance and barrier height. Also in FIG. 8, the junction between horizontal oxidation layer extension 36 and horizontal metallization layer extension 50 has substantially the same area as the junction between horizontal oxidation layer extension 40 and metallization 50.

In the preferred embodiment, metal layer strips 6 and 10 form the noted V-shape at 90°, though other configurations are of course possible. It is preferred that strips 6 and 10 be noncolinearly aligned. The area of overlap 14 is at the conjoint of the legs of the V formed by strips 6 and 10. At least a portion of the conjoint 14 is etched, FIG. 2, to provide generally vertical edge 18 facing away from the legs 6 and 10 of the V. Fast etch rate insulating layer 8 is undercut etched horizontally inwardly away from vertical edge 18 in a direction toward the legs 6 and 10 of the V.

It is recognized that various alternatives and modifications are possible within the scope of the appended claims.

We claim:

1. A method for fabricating an MOMOM tunnel device comprising:
    providing an insulating substrate;
    forming a first metal layer on said substrate, then a first insulating layer on said first metal layer, then a second metal layer on said first insulating layer, wherein said layers have vertically overlapped portions;
    defining a generally vertical edge through said overlapped layer portions;
    subjecting said substrate and layers to an oxidizing atmosphere such that first and second oxidation layers are formed on the edges of respective said first and second metal layers exposed by said generally vertical side;
    forming a third metal layer vertically between said first and second oxidation layers.

2. The invention according to claim 1 comprising:
    forming a second insulating layer on said second metal layer prior to said step of defining a generally vertical side; and
    forming said third metal layer horizontally along the top of said second insulating layer and generally vertically along said generally vertical side of said layers over and between said first and second oxidation layers.

3. The invention according to claim 2 comprising:
    providing said first insulating layer of a material having a faster etch rate than said second insulating layer;
    etching said layers to form an undercut in said first insulating layer extending generally horizontally inwardly from said generally vertical side;
    subjecting said layers and said substrate to an oxidizing atmosphere such that said first oxidation layer also extends horizontally along the top of said first metal layer along said undercut, and said second oxidation layer extends horizontally along the bottom of said second metal layer along said undercut and spaced above said horizontal first oxidation layer extension; and
    forming said third metal layer with a portion extending horizontally inwardly into said undercut between said horizontal first and second oxidation layer extensions.

4. A method for fabricating an MOMOM tunnel device comprising:
    providing an insulating substrate;
    forming a first metal layer on said substrate, and then an insulating layer on said first metal layer, and then a second metal layer on said insulating layer such that said layers have vertically overlapped portions;
    defining a generally vertical side through said layers;
    forming an undercut in said insulating layer extending horizontally inwardly from said generally vertical edge;
    forming a first oxidation layer in said undercut extending horizontally along the top of said first metal layer;
    forming a second oxidation layer in said undercut extending horizontally along the bottom of said second metal layer and spaced above said first oxidation layer; and
    forming a third metal layer having a portion extending horizontally inwardly into said undercut between said first and second horizontal oxidation layers.

5. The invention according to claim 4 comprising forming said oxidation layers by growing oxide in a field directed plasma, said field being directed generally vertically such that thick oxide grows along the generally vertical edges of said first and second metal layers exposed by said generally vertical side, and thinner oxide grows along said horizontal top and bottom surfaces of said respective first and second metal layers in said undercut.

6. The invention according to claim 5 comprising:
    forming a second insulating layer on said second metal layer and of a material having a slower etch rate than said first insulating layer;
    forming said undercut by etching said layers;
    forming said third metal layer horizontally along the top of said second insulating layer and vertically along said generally vertical side of said layers over and between said first and second oxidation layers including said thick and thinner portions.

7. The invention according to claim 6 comprising providing said first and second metal layers of different material to provide different oxidation growth rates of said first and second oxidation layers such that one of said first and second oxidation layers in said undercut is vertically thicker than the other of said first and second oxidation layers in said undercut.

* * * * *